(12) United States Patent
Buffle et al.

(10) Patent No.: US 11,955,568 B2
(45) Date of Patent: Apr. 9, 2024

(54) TRENCH CAPACITOR STRUCTURE WITH HYBRID FILLING LAYER

(71) Applicant: Murata Manufacturing Co., Ltd., Nagaokakyo (JP)

(72) Inventors: Larry Buffle, Grenoble (FR); Frédéric Voiron, Barraux (FR); Sophie Archambault, Grenoble (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/831,050

(22) Filed: Jun. 2, 2022

(65) Prior Publication Data
US 2022/0393038 A1 Dec. 8, 2022

(30) Foreign Application Priority Data
Jun. 4, 2021 (EP) .................. 21305761

(51) Int. Cl.
*H01L 29/94* (2006.01)
*H01L 49/02* (2006.01)

(52) U.S. Cl.
CPC ............ *H01L 29/945* (2013.01); *H01L 28/75* (2013.01); *H01L 28/90* (2013.01); *H01L 28/91* (2013.01)

(58) Field of Classification Search
CPC ............ H01L 29/66181; H01L 29/945; H01L 28/90–92
See application file for complete search history.

(56) References Cited

U.S. PATENT DOCUMENTS

| 10,546,917 B1 * | 1/2020 | Tsai ..................... H01L 28/91 |
| 2015/0206662 A1 | 7/2015 | Lamy et al. |
| 2017/0104057 A1 | 4/2017 | Voiron |
| 2020/0161416 A1 | 5/2020 | Tsai et al. |
| 2021/0005610 A1 | 1/2021 | Lu et al. |

FOREIGN PATENT DOCUMENTS

EP 3588560 A1 1/2020

\* cited by examiner

*Primary Examiner* — Jose R Diaz
(74) *Attorney, Agent, or Firm* — Arentfox Shiff LLP

(57) ABSTRACT

A capacitor structure that includes a silicon substrate having a trench structure formed therein; a dielectric disposed over a surface of the trench structure, conformal to the surface of the trench structure; and a filling layer disposed over the dielectric layer and into the trench structure, the filling layer including a conductive layer and a polymer layer.

10 Claims, 5 Drawing Sheets

TRENCH CAPACITOR STRUCTURE WITH HYBRID FILLING LAYER

CROSS REFERENCE TO RELATED APPLICATIONS

The present application claims priority to European Patent Application No. 21305761.5, filed Jun. 4, 2021, the entire contents of which are incorporated herein by reference.

FIELD OF THE INVENTION

The present invention relates to the field of integration and, more particularly, to electronic products, related semiconductor products, and their methods of manufacture.

TECHNICAL BACKGROUND

Increasing capacitance density is a key objective in the development of emerging capacitive components. In the case of silicon-integrated capacitors, one approach to boost capacitance density includes increasing the specific surface of the capacitive structure by 3D-structuring the surface of the wafer.

For example, FIG. 1 illustrates a conventional 3D trench capacitor structure 100. The conventional 3D trench capacitor structure 100 is obtained by forming a three-dimensional trench structure in a substrate 102. In one implementation, as shown in FIG. 1, the substrate 102, which may be made of silicon for example, provides the bottom electrode of the capacitor structure 100. In another implementation, a conductive layer (typically a metallic layer) is deposited into the trench structure to provide the bottom electrode.

A dielectric layer 104 (usually a mineral-type dielectric such as silicon oxide) is then deposited into the 3D trench structure, conformally to the surface of the trench structure. Remaining voids in the trench structure are filled by a conductive layer 106 which provides the top electrode layer of the capacitor structure 100. The conductive layer 106 is typically a semiconductor or a metallic layer.

In the emerging field of high voltage applications (operating/breakdown voltages from around 500 V to greater than 1 kV), another main concern is preventing early fails and/or premature wear out of the capacitor device due to the high voltage operation. This concern means that the operating electric field must be guaranteed with a sufficient margin for the desired lifetime of the device.

One way to sustain the operating electrical field is by increasing the thickness of the dielectric layer 104. However, the increase of the dielectric thickness brings various challenges as discussed below.

In one aspect, it is known that to obtain optimal dielectric properties, the dielectric layer should be deposited at high temperatures (e.g., above 600° Celsius). Generally, this results in an increase of mechanical stress in the structure when the wafer is then cooled down to ambient temperature. With the use of a thicker dielectric layer, this problem is exacerbated, leading to cracks and/or delamination being observed in the dielectric layer. These cracks and/or delamination not only introduce weak points in the dielectric layer but can also generate a great amount of particles that may contaminate clean-room deposition tools. In extreme cases, the mechanical stress in the structure can be so high as to cause severe deformation in the wafer to the point that the wafer can no longer be transported by automatic robotic handlers.

In another aspect, the increase of dielectric thickness increases electrical stress within the 3D structure which impacts the long-term robustness of the dielectric. Specifically, it is known that, in a 3D trench capacitor structure, the electrostatic field exhibits magnitude peaks at singular points (e.g., sharp corners) of the electrode geometry. These peak magnitudes are due to the difference in length/surface between the opposite electrodes at the singular points (e.g., the inner contour of a sharp corner has a smaller length/surface than the outer contour of the corner), which induces a difference of charge density near the singular points. The increase of the thickness of the dielectric further widens the difference in length/surface between the opposite electrodes at the singular points and causes even greater electrostatic field concentrations at the singular points, resulting in faster dielectric wear out and/or earlier breakdown.

Generally, this problem is even more pronounced in highly confined 3D structures (structures in which the trench width only slightly (e.g., by less than 100 nanometers) exceeds the dielectric thickness), resulting in a tradeoff between increasing capacitance density and achieving the desired operating/breakdown voltage in such structures.

To the above-discussed challenges due to the increase of the dielectric thickness is added the problem that, conventionally, the top electrode layer is also known to greatly increase mechanical stress in the structure. This is particularly the case when the top electrode is provided by the deposition of a relatively thick (e.g., 1-2 microns) semiconductor or metallic layer that is also used as a planarization layer. To ease this problem, a thinner top electrode layer may be used. However, this comes at the expense of increasing the electrical series resistance (ESR) of the capacitor structure, rendering it less suited for various applications. Additionally, the use of a thinner top electrode may result in voids remaining in the trench structure in between the vertical walls of the top electrode layer. These voids can jeopardize subsequent wet operations by causing infiltration into the structure and may also result in a loss of planarization to the detriment of following processing steps.

In light of the above challenges, a first approach to increase capacitance density (without degrading the operating/breakdown voltage of the capacitor structure) involves reducing certain dimensions of the trench structure (e.g., reducing the width of trenches and/or the separation between adjacent trenches while keeping the depth of the trenches the same). As a rule of thumb, a reduction by 2 enhances, for an equal depth, the specific surface of the capacitor structure by 2. However, this approach has limitations including a higher potential of wafer deformation, higher electrical stress in the structure, and more difficult processing (etching and filling) due to the 3D structure being more confined.

A second approach includes the use of a less confined 3D trench structure and the stacking of several capacitor blocks (e.g., several metal-insulator-metal (MIM) blocks) into the 3D structure. The capacitor blocks can then be connected in parallel, thereby multiplying the specific surface of the 3D structure by the number of capacitor blocks. The resulting capacitor structure induces a lower wafer deformation. However, the parallel interconnection between the capacitor blocks typically requires a dedicated interconnection as described in US 2017/0104057 A1 to keep low electrical parasitics.

In both approaches, however, a critical total dielectric thickness of about 1.5 microns has been determined experimentally for target 3D structures (generally, structures with a trench depth between 10 and 100 microns and an aspect ratio (width/depth) between 1:10 and 1:50). Near or beyond this value, mechanical stress in the structure reaches a high enough level that layers are prone to highly deform the wafer (warpage/bowing) and/or to relax internal mechanical stress through cracks and/or delamination. For example, for more confined structures according to the first approach, the single dielectric layer in the structure can be maximally be between 1.2 and 1.5 microns. This precludes achieving operating/breakdown voltages above approximately 1 kV. According to the second approach, dielectric layers can maximally be between 600 and 750 nanometers in the case of a double MIM stacked in the structure. In this case, operating/breakdown voltages are limited to approximately 500 V.

SUMMARY OF THE INVENTION

The present invention provides a capacitor structure, comprising:
- a silicon substrate having a trench structure formed therein;
- a dielectric layer disposed over a surface of the trench structure, conformal to the surface of the trench structure; and
- a filling layer disposed over the dielectric layer and into the trench structure, the filling layer comprising a conductive layer and a polymer layer.

The trench structure is a 3D trench structure. The 3D trench structure may be obtained by etching the silicon substrate to form trenches in a top surface of the substrate. The trenches are characterized by a trench geometry defined by a trench depth, a trench width, and an inter-trench separation. The trench depth and the trench width define an aspect ratio of the trenches. Additionally, the 3D structure is characterized by a trench layout. The trench layout defines the overall shape of the trench structure. The trench layout may be obtained from a 3D pattern that is repeated over the wafer.

As a hybrid layer formed from a conductive layer and a polymer layer, the filling layer provides several degrees of freedom in shaping the properties and performance of the capacitor structure.

In an embodiment, the dielectric layer comprises a mineral-type dielectric layer. The mineral-type dielectric may comprise silicon dioxide, silicon nitride, or silicon oxynitride, for example. Mineral-type dielectric materials are widely used in capacitor structures due to their high dielectric strength and well-known integration. However, they exhibit high mechanical stress in the capacitor structure beyond a critical thickness.

The use of the hybrid layer in the capacitor structure allows to shift a part of the dielectric contribution of the mineral-type dielectric layer to a layer that is less mechanically stressful. Specifically, in an embodiment, the polymer layer may be used as a complementary dielectric to a main dielectric provided by the mineral-type dielectric layer.

In an embodiment, the polymer layer is made of Parylene AF-4. Parylene AF-4 provides a relatively high breakdown field (8-10 MV/cm), which is comparable to the breakdown field of mineral-type dielectrics (about 10 MV/cm). This allows the polymer layer to be set at a comparable thickness relative to the thickness of the mineral-type dielectric layer that it is intended to replace or supplement. As such, the use of the polymer layer results in moderate added thickness to the capacitor structure profile. The low required thickness of the polymer layer may be exploited by reducing the dimensions of the trench structure (e.g., reducing the trench width and separation, thereby increasing the capacitance density of the structure. Alternatively, the trench depth may be decreased, reducing process complexity and overall stress.

In an embodiment, the conductive layer comprises a metallic layer or a polysilicon layer. The metallic layer may comprise titanium nitride or vanadium nitride or tungsten nitride for example.

In an embodiment, the conductive layer is disposed over the dielectric layer and the polymer layer is disposed over the conductive layer.

In a particular embodiment, the capacitor structure is a single MIM structure. The conductive layer provides a top electrode of the capacitor structure. The polymer layer disposed over the conductive layer acts a mechanical filling element of the structure. As such, the polymer layer allows to reduce the thickness of the conductive layer. As the polymer layer is generally less mechanically stressful than the conductive layer (among other factors, due to its deposition being performed at ambient temperature), overall mechanical stress in the structure can be reduced.

In an implementation of this particular embodiment, the conductive layer and the polymer layer may completely fill the trench structure. With the polymer layer disposed over the conductive layer, the polymer layer may be used as a planarization layer for subsequent photolithography steps.

In example implementations of this particular embodiment, where a trench depth of the trench structure ranges between 10 and 100 microns and an aspect ratio of the trench structure ranges between 1:10 and 1:60, a thickness of the dielectric layer ranges between 0.6 and 1.5 microns, a thickness of the conductive layer ranges between 10 and 500 nanometers, and a thickness of the polymer layer ranges between 150 and 2000 nanometers (i.e. greater than the remaining void).

The thickness of the conductive layer may depend on its implementation. For example, where the conductive layer is a metallic layer, its thickness may range from 10 to 50 nanometers. Where the conductive layer is a polysilicon layer, it may range from 50 nanometers to a few microns (e.g., 1.5 microns).

In another embodiment, the polymer layer is disposed over the dielectric layer and the conductive layer is disposed over the polymer layer.

In a particular embodiment, the capacitor structure is a single MIM capacitor. The conductive layer provides a top electrode of the capacitor structure. With the polymer layer disposed between the dielectric layer and the conductive layer, the polymer layer acts as both a mechanical filling element and as an active electrical element of the structure. Specifically, as part of the dielectric of the structure, the polymer layer contributes towards the operating/breakdown voltage of the structure, allowing to push this voltage beyond a maximum achievable observed in conventional structures. Furthermore, as a mechanical filling element, the polymer layer allows the conductive layer thickness to be reduced, decreasing mechanical stress in the structure.

In example implementations of this particular embodiment, where a trench depth of the trench structure ranges between 10 and 100 microns and an aspect ratio of the trench structure ranges between 1:10 and 1:60, a thickness of the dielectric layer ranges between 0.6 and 1.5 microns, a thickness of the polymer layer ranges between 150 and 2000 nanometers, and a thickness of the conductive layer ranges between 10 and 50 nanometers.

In another embodiment, the capacitor structure may comprise multiple capacitor blocks stacked into the trench structure. The multiple stacked capacitor blocks may be connected in series or in parallel.

In an embodiment, the capacitor structure is a MIMIM capacitor structure. In a particular embodiment, the MIMIM capacitor structure is formed by the conductive layer disposed over the dielectric layer, the polymer layer disposed over the conductive layer, and by a further conductive layer disposed over the polymer layer. The further conductive layer may be a metallic layer. As such, the capacitor structure comprises a first MIM block (the substrate, the dielectric layer, and the conductive layer) and a second MIM block (the conductive layer, the polymer layer, and the further conductive layer).

In example implementations of this particular embodiment, where a trench depth of the trench structure ranges between 10 and 100 microns and an aspect ratio of the trench structure ranges between 1:10 and 1:60, a thickness of the dielectric layer ranges between 0.6 and 1.5 microns, a thickness of the conductive layer ranges between 10 and 500 nanometers, a thickness of the polymer layer ranges between 150 and 2000 nanometers, and a thickness of the further conductive layer ranges between 10 and 50 nanometers.

The thickness of the conductive layer may depend on its implementation. For example, where the conductive layer is a metallic layer, its thickness may range from 10 to 50 nanometers. Where the conductive layer is a polysilicon layer, it may range from 50 nanometers to a few microns (e.g., 1.5 microns).

In an embodiment, the first and second MIM blocks of the MIMIM structure may be connected in parallel by electrically connecting the conductive layer and the further conductive layer. As such, the capacitances of the two blocks add up to each other providing a greater resultant capacitance for the structure. The increased overall capacitance may be used in part to relax the aspect ratio of the 3D capacitor structure. As a consequence, mechanical and/or electrical stress can also be reduced in the structure.

In the parallel configuration, to ensure that the overall breakdown voltage is not diminished by the parallel connection, in an embodiment, the second MIM block is configured to withstand at least equivalent voltage stress as the first MIM block. This requirement may be achieved by appropriately configuring the thickness of the polymer layer as a function of the thickness of the dielectric layer and of the breakdown fields of the materials making the dielectric layer and the polymer layer. In an embodiment, the thickness of the polymer layer is set as equal to the thickness of the dielectric layer multiplied by the ratio of the breakdown field of the material of the dielectric layer to the breakdown field of the material of the polymer layer.

It should be noted that the person skilled in the art will be able to determine the ratio of the breakdown field of the material of the dielectric layer to the breakdown field of the material of the polymer layer because these two layers have a same geometry (in 3D). This allows neglecting the geometrical factors that may affect the breakdown field.

In fact, the variation of breakdown field related to a same geometrical factor is equal for two dielectric materials of equal thickness deposited on the same geometry. The ratio remains constant irrespective of the geometry for these two layers.

In another embodiment, the first and second MIM blocks may be connected in series. As such, a greater resultant breakdown voltage can be achieved for the structure. The increased overall breakdown voltage may be used in part to relax the aspect ratio of the 3D capacitor structure. As a consequence, mechanical and/or electrical stress can also be reduced in the structure.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

As further described below, embodiments of the present invention address the existing deficiencies of the prior art by providing 3D capacitor structures that are less prone to mechanical and electrical stress than conventional structures. Additionally, the proposed 3D capacitor structures can achieve, for a lower aspect ratio, equal or greater capacitance density and/or equal or greater operating/breakdown voltage than comparable conventional structures.

Figure 1:
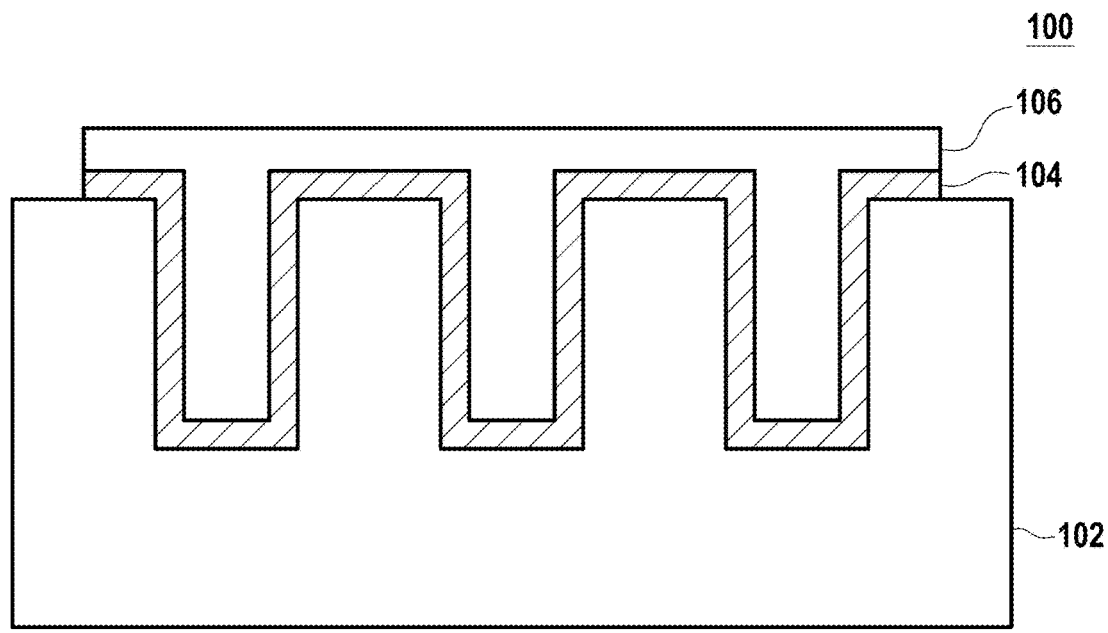
FIG. 1 illustrates a conventional 3D trench capacitor structure.
Figure 2:
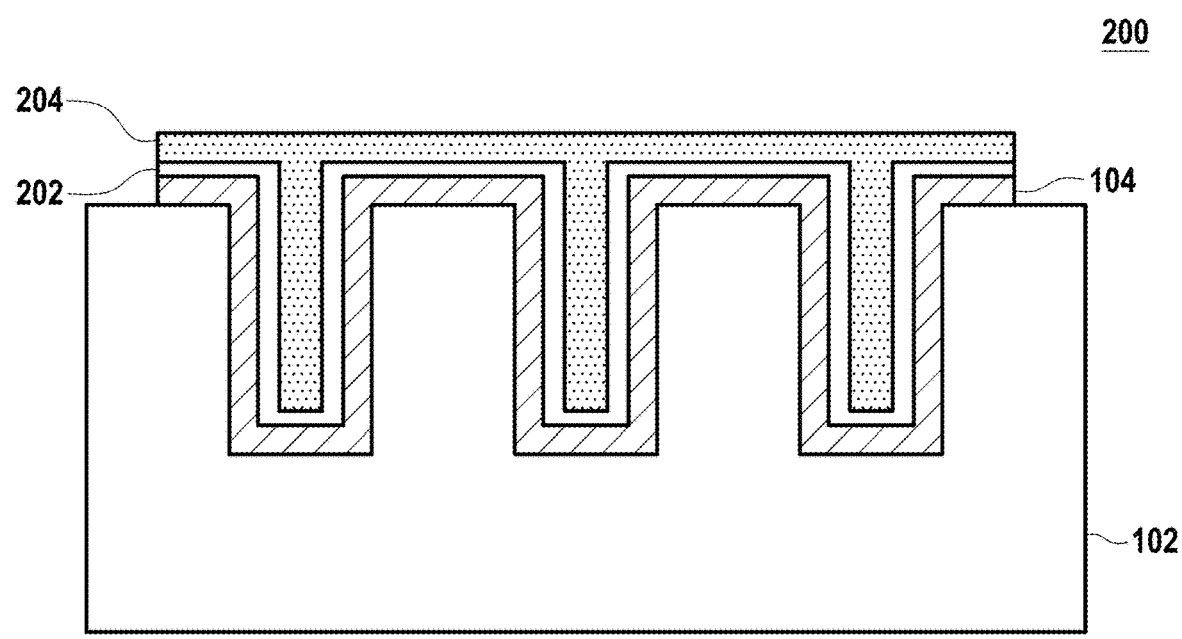
FIG. 2 illustrates a 3D trench capacitor structure according to an embodiment of the present invention.

According to a first embodiment of the present invention, the proposed 3D capacitor structures improve on conventional structures by lowering the mechanical stress due to the top electrode of the capacitor structure. FIG. 2 illustrates an example 3D trench capacitor structure 200 according to this embodiment. As shown in FIG. 2, capacitor structure 200 includes a substrate 102, a dielectric layer 104, a conductive layer 202, and a polymer layer 204.

As discussed earlier, substrate 102 has a three-dimensional (3D) trench structure formed therein. The 3D trench structure includes a plurality of trenches characterized by a trench depth, a trench width, and an inter-trench separation. The ratio of the trench width to the trench depth is known as the aspect ratio (AR) of the 3D trench structure. In an embodiment, the 3D trench structure may have a trench depth varying between 20 and 50 microns and an AR varying between 1:20 and 1:45. However, as would be understood by a person of skill in the art based on the teachings herein, embodiments are not limited to this example.

In one implementation, the substrate 102 may be made of silicon for example, and provides the bottom electrode of the capacitor structure 200. In another implementation, a conductive layer (typically a metallic layer) is deposited into the trench structure over the substrate 102 to provide the bottom electrode.

The dielectric layer 104 is typically a mineral-type dielectric, such as silicon oxide, silicon nitride, or silicon oxynitride. The dielectric layer 104 is deposited in a conformal manner over and into the 3D trench structure. In an embodiment, the deposition is performed at high temperature (e.g., 600 to 900° C.) depending on the material used.

According to the embodiment of FIG. 2, the operating/breakdown voltage of the 3D capacitor is determined almost entirely by the thickness of the dielectric layer 104. Additionally, as discussed above, the thickness of the dielectric layer 104 governs the level of electrical stress within the structure. As such, in an embodiment, the 3D trench geometry 104 may be configured according to optimization rules to ensure suitable electrical properties (i.e., acceptable electrical stress) for the largest possible thickness of the dielectric layer 104.

Such optimization rules may include rounding the corners of the 3D trench structure to reduce electrical stress as described in EP 3 588 560 A1. Additionally or alternatively, the material of the dielectric layer 104 may be optimized by using oxide and nitride configurations (e.g., configurations having at least 10% of a high-strength dielectric) to increase the dielectric constant of the dielectric layer 104. As such, both the capacitance density and the operating/breakdown voltage of the capacitor structure can be increased.

In an embodiment, where the trench depth ranges between 10 and 100 microns and the aspect ratio ranges between 1:10 and 1:60, the thickness of the dielectric layer 104 may vary for example between 0.15 and 3 µm depending upon the target voltage.

After the deposition of the dielectric layer 104 into the 3D trench structure, voids remain in the trench structure to accommodate the top electrode. It is noted that the voids can be larger than in conventional structures when a corner rounding optimization of the 3D trench geometry is adopted. As described above, it is current practice in the industry to fill these voids using for example a relatively thick (e.g., 3 microns) metallic layer, which provides the top electrode of the capacitor structure and which also serves as a planarization layer for subsequent photolithography steps. However, such an implementation aggravates the mechanical stress within the structure and effectively lowers the largest possible thickness of the dielectric layer 104 and by consequence the operating/breakdown voltage of the capacitor.

In accordance with the embodiment of FIG. 2, the voids in the trench structure are filled by a hybrid filling layer disposed over the dielectric layer 104 and into the trench structure. The hybrid filling layer comprises a conductive layer 202 and a polymer layer 204. The conductive layer 202 is disposed over the dielectric layer 104 and the polymer layer 204 is disposed over the conductive layer 202.

In an embodiment (not shown in FIG. 2), the polymer layer 204 may be etched in a first region to enable an electrical contact with the conductive layer 202 to be provided. Similarly, the polymer layer 204, the conductive layer 202, and the dielectric layer 104 may be etched in a second region to allow an electrical contact with the substrate 102 to be made.

Depending on its implementation, the conductive layer 202 is made as thin as possible while ensuring that the ESR of the capacitor structure remains within acceptable levels. This contributes to a lower mechanical stress in the structure and reduces potential wafer bow and/or delamination.

In an embodiment, the conductive layer 202 may comprise a metallic layer and/or a polysilicon layer. The metallic layer may be made of titanium nitride or vanadium nitride or tungsten nitride for example. In an embodiment, the metallic layer is formed in the trench structure using a thin-film deposition technique (e.g., atomic layer deposition (ALD)). The polysilicon layer may be formed in the trench structure using low-pressure chemical vapor deposition (LPCVD).

In an embodiment, where the trench depth ranges between 10 and 100 µm, the aspect ratio ranges between 1:10 and 1:60, and where the conductive layer 202 consists of a metallic layer, the thickness of the metallic layer may vary between 10 and 50 nanometers. In a particular embodiment according to this 3D trench geometry, the thickness of the metallic layer is less than 50 nanometers.

In another embodiment, where the trench depth ranges between 10 and 100 µm, the aspect ratio ranges between 1:10 and 1:60, and where the conductive layer 202 consists of a polysilicon layer, the thickness of the polysilicon layer may vary between 50 and a few microns (e.g., 1.5 microns). In a particular embodiment according to this 3D trench geometry, the thickness of the polysilicon layer is less than 500 nanometers.

According to the embodiment of FIG. 2, the thickness of the conductive layer 202 is configured such that voids still remain in the 3D trench structure after formation of the conductive layer 202. In an embodiment, the remaining voids are reduced to a small range (e.g., less than 50 nm), provided that the serial resistance due to the conductive layer 202 does not exceed a desired threshold.

In an embodiment, as shown in FIG. 2, the thickness of the polymer layer 204 is selected to completely fill these remaining voids. As such, the conductive layer 202 and the polymer layer 204 completely fill the trench structure. The polymer layer 204 may thus also serve as a planarization layer for subsequent photolithography steps. In another embodiment, the conductive layer 202 and the polymer layer 204 may be configured so as to leave voids in the 3D trench structure after deposition of the polymer 204. The voids may be left in the final structure or filled as further described below.

In an embodiment, where the trench depth ranges between 10 and 100 µm, and where the aspect ratio ranges between 1:10 and 1:60, the thickness of the dielectric layer 104 ranges between 0.6 and 1.5 microns, the thickness of the conductive layer 202 ranges between 10 nanometers and 500 nanometers, and the thickness of the polymer layer 204 ranges between 150 and 2000 nanometers. In a particular embodiment according to this 3D trench geometry, the conductive layer 202 is a metallic layer ranging in thickness between 10 and 50 nanometers. In another particular embodiment according to this 3D trench geometry, the conductive layer 202 is a polysilicon layer ranging in thickness between 50 nanometers and a few microns (e.g., 1.5 microns).

The use of the hybrid layer as discussed above significantly reduces mechanical stress within the structure 200 compared to conventional structure 100 for example. Specifically, in one aspect, the reduction in mechanical stress can be attributed to the lower thermal budget required to form the hybrid filling layer than to form the top electrode layer 106. For example, where the conductive layer 202 is made of polysilicon, the conductive layer 202 may be deposited at a temperature of around 600° C. In the case that the conductive layer 202 is a metallic layer (e.g., TiN or MoN), the thermal budget can be even lower with the metallic layer deposited at around 380° C. In both cases, the polymer layer 204 may be deposited at ambient temperature with subsequent annealing at 380-400° C. This thermal processing is lower than the 600-900° C. range required for the top electrode layer 106.

Preferably, the polymer layer 204 is made of a high-performance polymer to avoid issues during back-end processing. Such high-performance polymer may present a controlled composition (in terms of molecular chain) that remains stable during the processing flow, and especially the thermal budget that might be as high as 400° Celsius for example during back-end processing. Specifically, it is desired that the polymer exhibits a high decomposition temperature, a low thermal loss, a low moisture absorption, and resistance to solvents.

Further, the polymer 204 needs to be one that is compatible with high aspect ratio (e.g., 1:20 to 1:50) conformal deposition. This is important in order to avoid the formation of residual voids in the polymer, which could expand during later processing steps.

Figure 3:
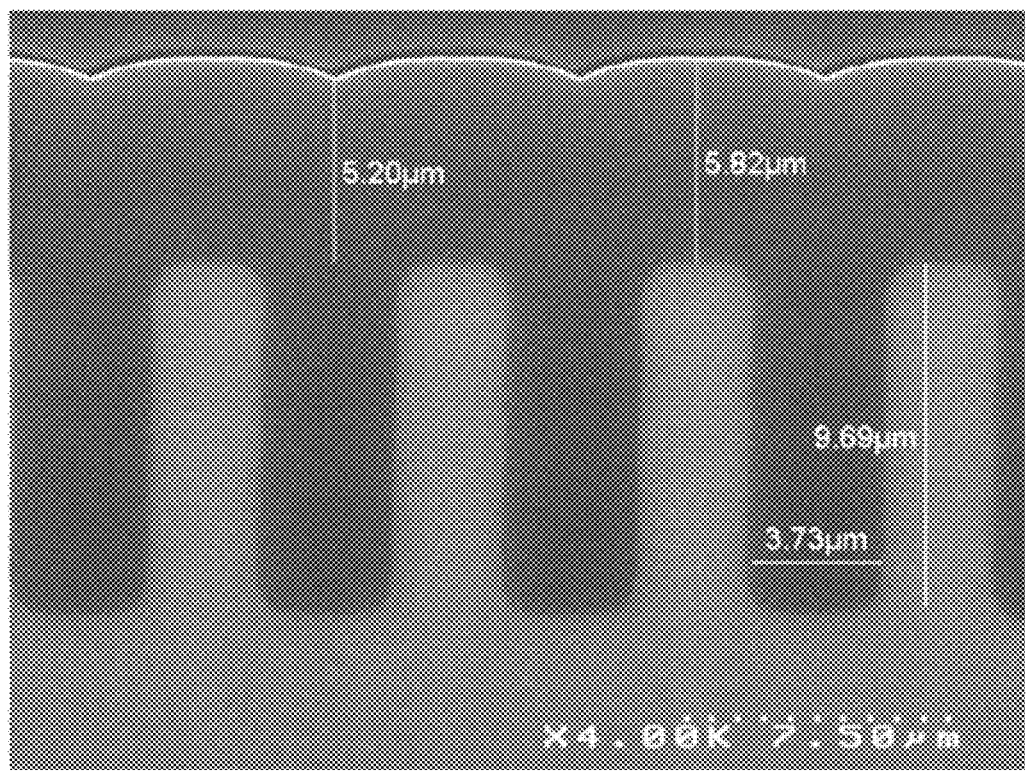
FIG. 3 is a scanning electron microscopy (SEM) image that shows the deposition of a polymer layer into a 3D structure.

An example polymer that meets these properties is Parylene AF-4. FIG. 3 is a SEM image that shows the deposition of a layer of Parylene AF-4 over and into a 3D trench structure. The 3D trench structure has a depth of approximately 10 microns and a width of approximately 3.75 microns.

As shown in FIG. 3, the Parylene deposition is substantially conformal over the 3D structure, with no voids or holes in the deposition. As such, when Parylene AF-4 is used for the polymer layer 204 in structure 200, the polymer layer 204 can provide an excellent planarization layer for subsequent processing steps, with low risk of infiltration into the structure.

As mentioned above, typically, the polymer layer 204 is deposited at ambient temperature. To increase its density, an annealing step at 380-400° C. may be used.

Figure 4:
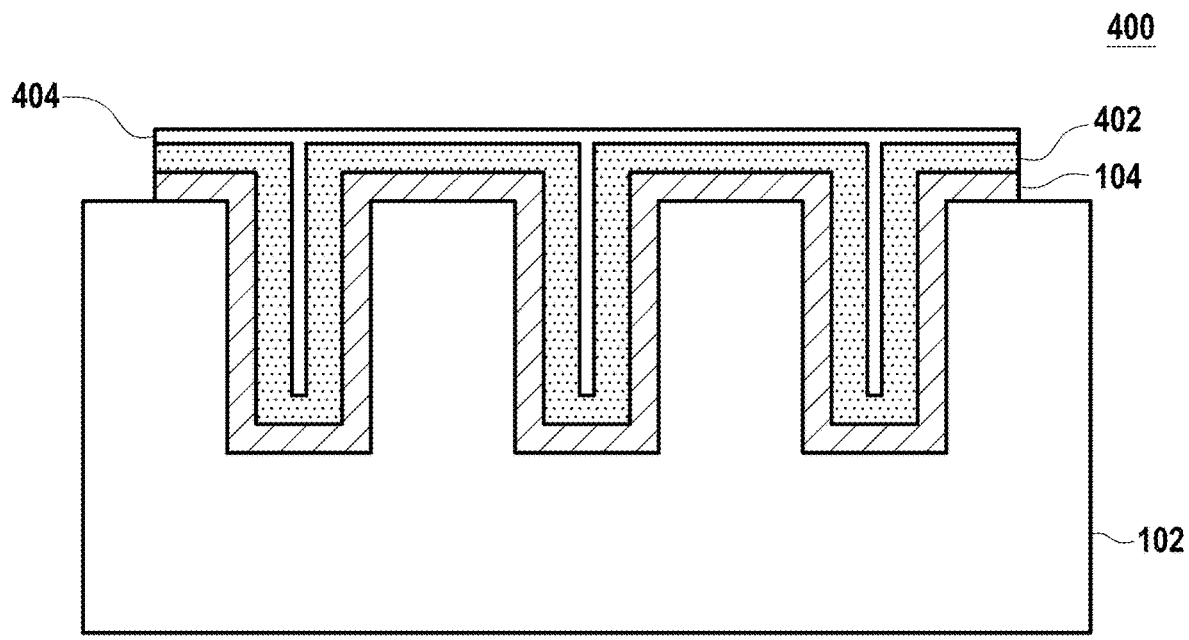
FIG. 4 illustrates a 3D trench capacitor structure according to another embodiment of the present invention.

According to a second embodiment of the present invention, the proposed 3D capacitor structures improve on conventional structures by increasing the operating/breakdown voltage of the structure as well as lowering the mechanical stress due to both the mineral-type dielectric layer 104 and the top electrode of the capacitor structure. FIG. 4 illustrates an example 3D trench capacitor structure 400 according to this embodiment. As shown in FIG. 4, capacitor structure 400 includes a substrate 102, a dielectric layer 104, a polymer layer 402, and a conductive layer 404.

In an embodiment, substrate 102 and dielectric layer 104 may be as described above with respect to 3D structure 200 of FIG. 2.

As in the first embodiment, the polymer layer 402 and the conductive layer 404 form a hybrid filling layer which is disposed over the dielectric layer 104 and into the trench structure. However, in contrast to the first embodiment, in the second embodiment, the polymer layer 402 is disposed over the dielectric layer 104, and the conductive layer 404 is disposed over the polymer layer 402.

As such, rather than having a merely mechanical role as a filling layer as in the first embodiment, the polymer layer 402 is also an active electrical element of the structure 400. Specifically, as part of the dielectric of the structure 400, the polymer layer 402 contributes towards the operating/breakdown voltage of the structure 400, pushing this voltage beyond the maximum achievable (approximately 1 kV for more confined structures, 500 V for less confined structures) observed in conventional structures.

In an embodiment, the thickness of the dielectric layer 104 may be set as discussed above with respect to structure 200 of FIG. 2, namely at the largest possible thickness that ensures acceptable mechanical and electrical stress in the structure. To increase this largest possible thickness, the 3D trench geometry and/or the material of dielectric layer 104 may be optimized as discussed above.

In another embodiment, the contribution of the polymer layer 402 towards the operating/breakdown voltage may be used to relax the contribution of the dielectric layer 104. This allows for the thickness of the dielectric layer 104 to be reduced, decreasing the mechanical stress due to the dielectric layer 104 in the structure. As the polymer layer 402 is less mechanically stressful than the dielectric layer 104 (per unit of thickness), overall mechanical stress in the structure is reduced.

Additionally, as discussed above with respect to structure 200, a further reduction in mechanical stress in structure 400 can be attributed to the lower thermal budget required to form the hybrid layer than to form the top electrode layer 106 as in structure 100 for example.

In an embodiment, where the trench depth ranges between 10 and 100 μm and the aspect ratio ranges between 1:10 and 1:60, the thickness of the dielectric layer 104 may vary between 0.6 and 1.5 microns and the thickness of the polymer layer 402 may vary between 0.15 and 3 microns.

As in the first embodiment, the polymer layer 402 may be a high-performance polymer, allowing for high aspect ratio conformal deposition. Additionally, the polymer may be selected to have a comparable breakdown field to the material of dielectric layer 104.

The polymer layer 402 may be deposited at ambient temperature. To increase its density, if necessary, a subsequent annealing at 380-400° C. may be used.

As an example, the polymer may be Parylene AF-4 as described above in the first embodiment.

In an embodiment, after deposition of the polymer layer 402, small voids (e.g., ~50-200 nanometers in width) are left in the trench structure to be filled by the conductive layer 404, which provides the top electrode of the structure 400.

As in the first embodiment, the conductive layer 404 may comprise a metallic layer. The metallic layer may be made of titanium nitride or vanadium nitride or tungsten nitride for example. In an embodiment, the metallic layer is formed using ALD.

In an embodiment, to promote adhesion at the polymer-electrode interface, reactive treatments (e.g., surface functionalization) may be applied onto the polymer layer 402. Alternatively or additionally, a very thin (less than 50 nanometers) inter-layer deposition may be performed before forming the conductive layer 404. The inter-layer deposition may be a deposition of silicon nitride. An added benefit of the inter-layer is that it protects the polymer layer 402 from chemicals during manufacturing.

In an embodiment, where the trench depth ranges between 10 and 100 μm and the aspect ratio ranges between 1:10 and 1:60, a thickness of the dielectric layer 104 ranges between 0.6 and 1.5 microns, a thickness of the polymer layer 402 ranges between 0.15 and 3 microns, and a thickness of the conductive layer 404 ranges between 10 and 50 nanometers.

According to a third embodiment of the present invention, the proposed 3D capacitor structures improve on conventional structures by enabling greater capacitance density and/or greater operating/breakdown voltage. This superior performance in terms of capacitance density and/or operating/breakdown voltage may be used in part to relax the aspect ratio of the proposed 3D structures. As a consequence, mechanical and/or electrical stress can also be reduced in the structure.

Figure 5:
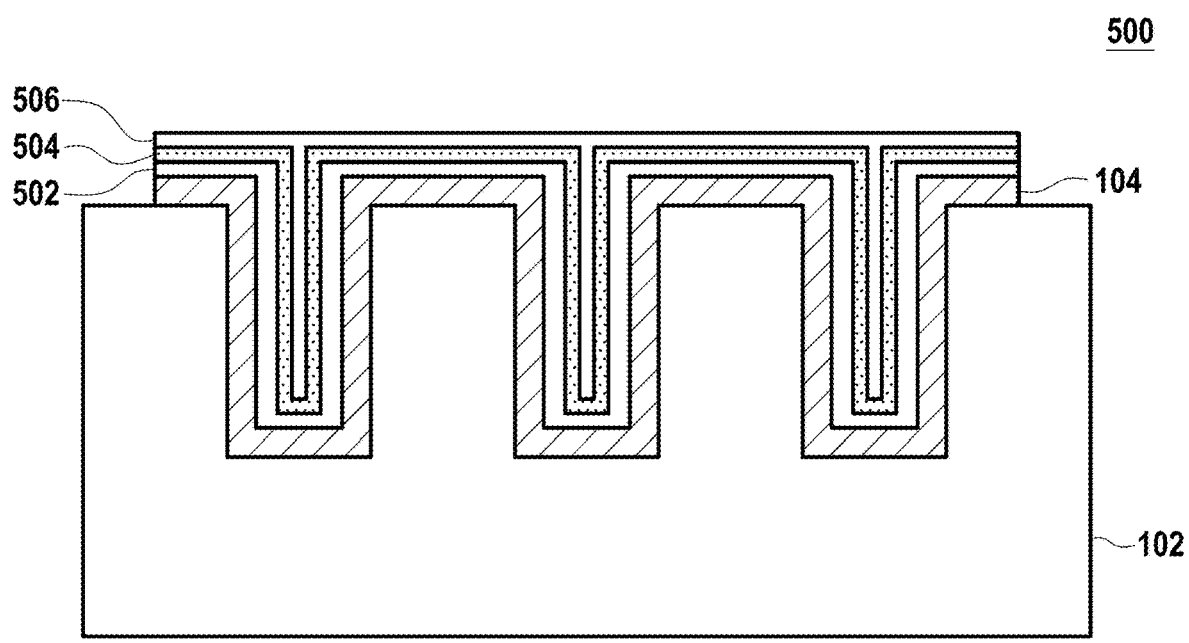
FIG. 5 illustrates a 3D trench capacitor structure according to yet another embodiment of the present invention.

FIG. 5 illustrates a 3D trench capacitor structure 500 according to this embodiment. As shown in FIG. 5, capacitor structure 500 includes a substrate 102, a dielectric layer 104, a conductive layer 502, a polymer layer 504, and a further conductive layer 506.

In an embodiment, substrate 102 and dielectric layer 104 may be as described above with respect to 3D structure 200 of FIG. 2.

Conductive layer 502, polymer layer 504, and conductive layer 506 form a hybrid filling layer which is disposed over the dielectric layer 104 and into the trench structure. In an embodiment, the hybrid filling layer completely fills the trench structure. The conductive layer 506 may thus be used as a planarization layer for subsequent photolithography steps. In another embodiment, residual voids may be left in the structure as long as their presence does not affect the subsequent photolithography steps.

Conductive layers 502 and 506 may each comprise a metallic layer. In another embodiment, the conductive layer 502 may comprise a polysilicon layer and the conductive layer 506 may comprise a metallic layer. The metallic layer may be made of titanium nitride or vanadium nitride or tungsten nitride for example. In an embodiment, the metallic layer is formed using ALD.

In an embodiment, the deposition of the polymer layer 504 may be configured to leave open a continuous interface in the center of the trench structure (e.g., 10-100 nanometers). This open continuous interface may be filled completely or partially by conductive layer 506.

To enable such deposition, polymer layer 504 may be, as in the first embodiment, a high-performance polymer which allows for high aspect ratio conformal deposition.

The polymer layer 504 may be deposited at ambient temperature. To increase its density, if necessary, a subsequent annealing at 380-400° C. may be used.

As an example, the polymer may be Parylene AF-4 as described above in the first embodiment.

In an embodiment, to promote adhesion at the polymer-electrode interface, reactive treatments (e.g., surface functionalization) may be applied onto the polymer layer 504. Alternatively or additionally, a very thin (less than 50 nanometers) inter-layer deposition may be performed before forming the conductive layer 506. The inter-layer deposition may be a deposition of silicon nitride. An added benefit of the inter-layer is that it protects the polymer layer 504 from chemicals during manufacturing.

As shown in FIG. 5, the structure 500 provides a stacked capacitor structure, specifically a MIMIM structure comprising a first MIM block (substrate 102, dielectric layer 104, and conductive layer 502) and a second MIM block (conductive layer 502, polymer layer 504, and conductive layer 506).

In an embodiment, the first and second MIM blocks of structure 500 may be connected in parallel by electrically connecting the conductive layers 502 and 506. As such, the capacitances of the two blocks add up to each other providing a greater resultant capacitance for the structure 500. In an embodiment, the first MIM block may be configured to provide a main capacitance contribution and the second MIM block may be configured to provide a complementary capacitance contribution lower than the main capacitance contribution of the first MIM. However, embodiments are not limited by this example. In any case, due to this additive effect, the structure 500 will have a greater capacitance density than a similar size conventional capacitor structure.

In a parallel configuration, the overall breakdown voltage of the structure 500 is equal to the lower one of the breakdown voltages of the first and second MIM blocks. To ensure that the overall breakdown voltage is not diminished by the parallel connection, in an embodiment, the second MIM block is configured to withstand at least equivalent voltage stress as the first MIM block. This requirement may be achieved by appropriately configuring the thickness of the polymer layer 504 as a function of the thickness of the dielectric layer 104 and of the breakdown fields of the materials making the dielectric layer 104 and the polymer layer 504. In an embodiment, the thickness of the polymer layer 504 is set as equal to the thickness of the dielectric layer 104 multiplied by the ratio of the breakdown field of the material of the dielectric layer 104 to the breakdown field of the material of the polymer layer 504.

Parylene AF-4 provides a relatively high breakdown field (8-10 MV/cm), which is comparable to the breakdown field of mineral-type dielectrics (about 10 MV/cm). This allows the polymer layer 504 to be set at a comparable thickness (e.g., a factor of 1.2) relative to the thickness of the dielectric layer 104 (e.g., 0.6-1.5 microns). This low thickness of polymer 504 may be exploited by reducing the dimensions of the trench structure (e.g., reducing the trench width and separation), further increasing the capacitance density of the structure.

In an example embodiment, wherein the trench depth ranges between 10 and 100 μm and the aspect ratio ranges between 1:10 and 1:60, the thickness of the dielectric layer 104 ranges between 0.6 and 1.5 microns, the thickness of the conductive layer 502 ranges between 10 and 500 nanometers, the thickness of the polymer layer 504 ranges between 150 and 2000 nanometers, and the thickness of the conductive layer 506 ranges between 10 and 50 nanometers.

The improved capacitance density of the structure 500 according to the parallel configuration may be used in an embodiment to relax the aspect ratio of the structure. This can facilitate certain processing steps (etching, filling, etc.) by making the structure less confined as well as reduce mechanical and/or electrical stress in the structure.

In another embodiment, the first and second MIM blocks of structure 500 may be connected in series. As such, although the structure 500 would have a total capacitance that is lower than the individual capacitance of each of the first and second MIM blocks, it will have a greater resultant breakdown voltage. This embodiment may be suited for very high voltage applications where the capacitance density is secondary to the operating/breakdown voltage.

In another aspect according to the present invention, mechanical stress in the proposed structures of the present invention may be further reduced by forming the trench structure using wall regions that are disposed in different directions along the substrate. This aspect is illustrated in FIG. 6, which is a top view of an example 3D trench layout 600 according to an embodiment.

Figure 6:
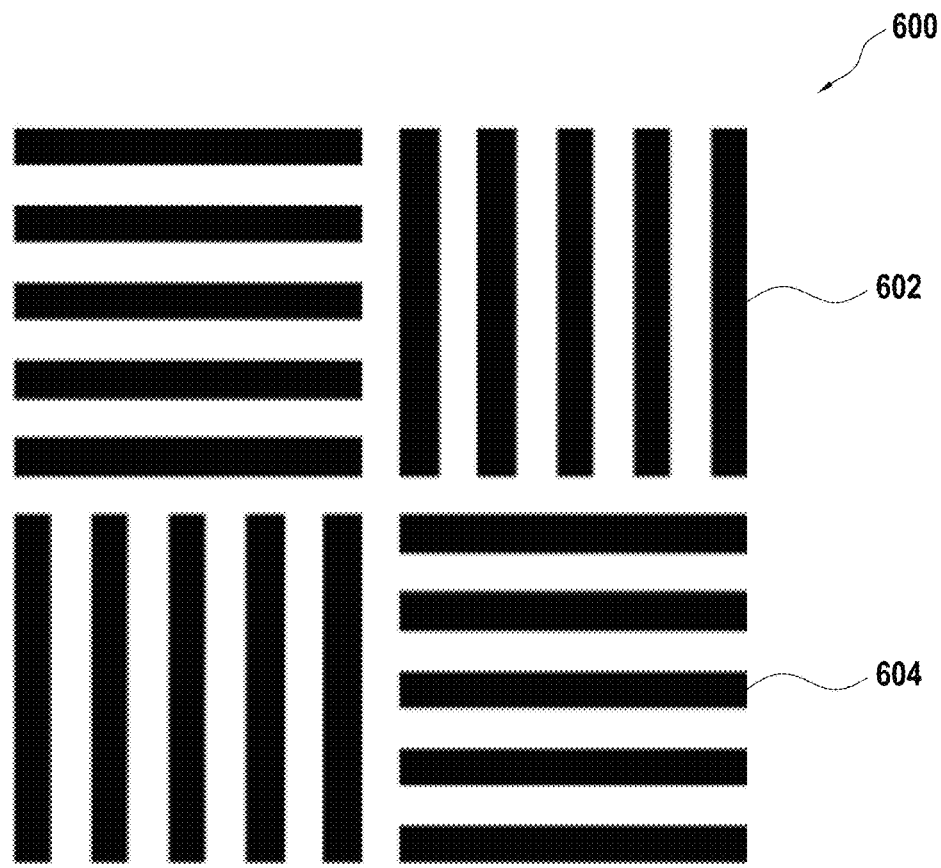
FIG. 6 illustrates an example 3D trench layout that may be used in embodiments of the present invention.

As shown in FIG. 6, trench layout 600 includes a plurality of wall regions, such as first and second wall regions 602 and 604. Each wall region comprises multiple walls having limited lengths. In an embodiment, the walls forming a wall region may be disposed along either a first direction or a second direction of the substrate. In other embodiments, more than two directions may be used. For example, in trench layout 600, the walls of the first wall region 602 are disposed along a first direction, and the walls of the second wall region 604 are disposed along a second direction.

The first direction and the second direction may form a defined angle with each other. The defined angle may be selected to reduce mechanical stress within the structure. In an embodiment, the first direction may be perpendicular to the second direction. However, embodiments are not limited to this implementation and other angle relationships (e.g., 10, 20, 30, 40, 60, and 120 degrees) between the first direction and the second direction may be used.

In an embodiment, wall regions disposed along the first directions and wall regions disposed along the second direction are disposed symmetrically to reduce mechanical stress along the first direction and the second direction. In an embodiment, a wall region disposed along the first direction is surrounded along its sides by wall regions disposed along the second direction, and vice versa.

In addition, as mentioned above, some or all of the corners of the trench structure may be rounded to reduce electrical stress.

Figure 7:
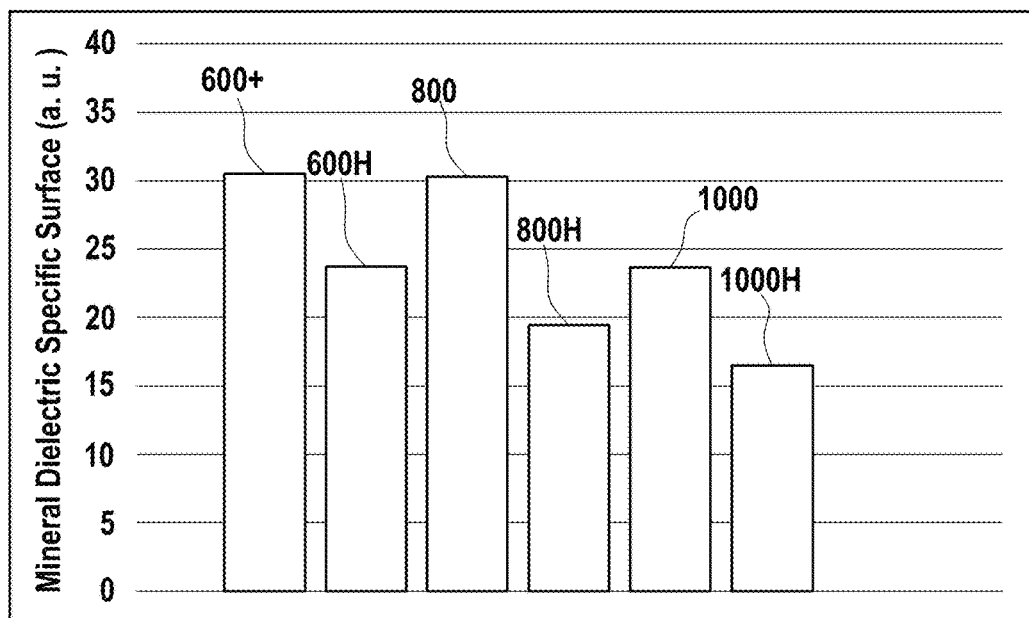
FIG. 7 illustrates the mechanical stress performance of embodiments of the present invention.
Figure 8:
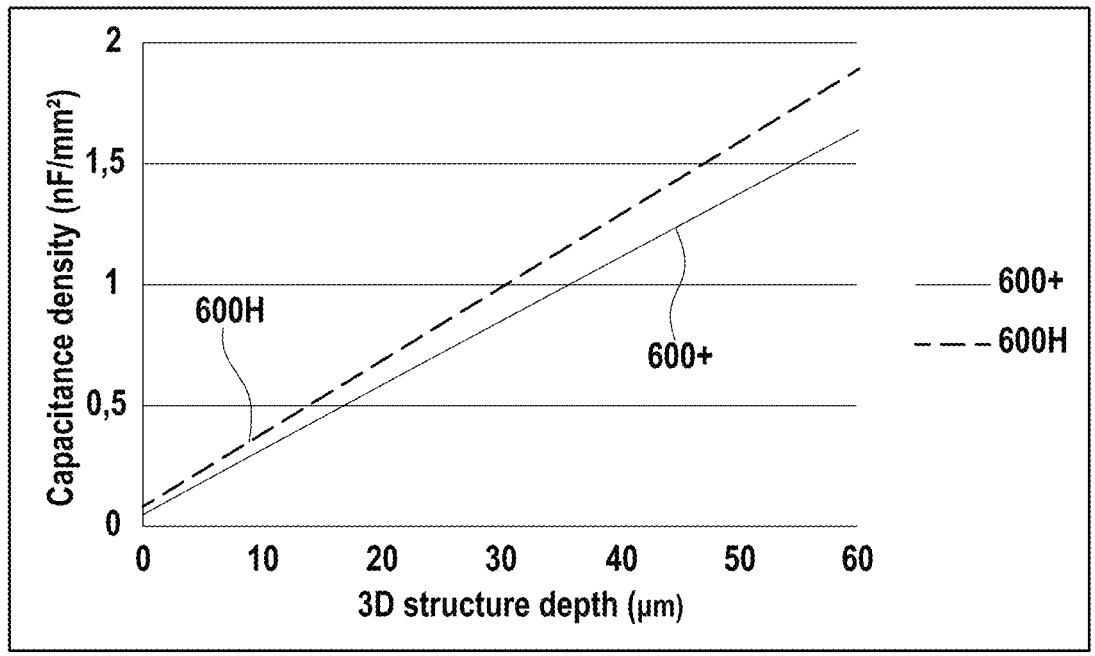
FIG. 8 illustrates the capacitance density performance of an embodiment of the present invention.
Figure 9:
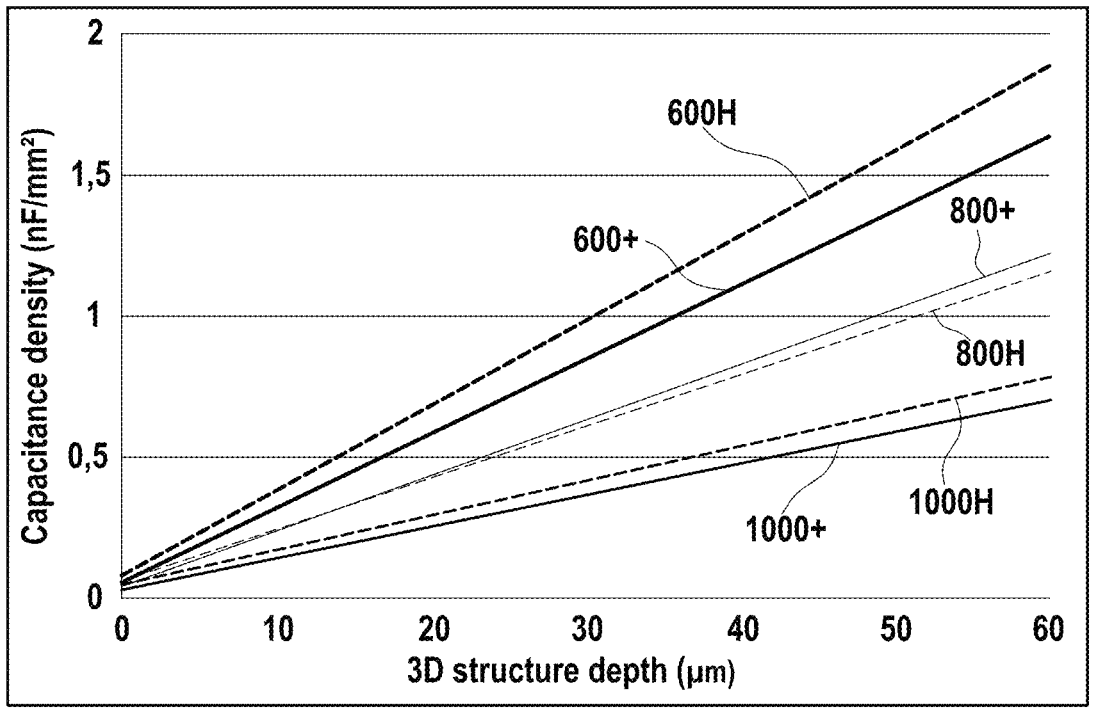
FIG. 9 illustrates the capacitance density performance of embodiments of the present invention over a range of target voltage applications.

FIGS. 7-9 illustrate example performance results comparing the proposed structures to conventional structures similar to structure 100 for example. These example results are provided for the purpose of illustration only.

FIG. 7 illustrates the mechanical stress performance of embodiments of the present invention. More particularly, FIG. 7 compares, for different operating/breakdown voltage profiles (600 V, 800 V, and 1 kV), an example capacitor structure according to the present invention with one or more conventional structures having comparable trench layout/geometry and equal or substantially equal capacitance density. As a measure of mechanical stress in the structure, the specific surface of the mineral-type dielectric in the structure is used.

Specifically, in FIG. 7, the structure labeled "600+" is a conventional single MIM structure (e.g., like structure 100). The geometry of structure "600+" is optimized for an operating/breakdown voltage of 600V with an aspect ratio of 1:30.

The structure "600H" corresponds to a double MIM structure in accordance with an embodiment of the present invention (e.g., similar to structure 500) designed for an operating/breakdown voltage of 600V. The structure "600H" has an aspect ratio of 1:20.

The structure "800+" corresponds to a conventional single MIM structure designed for an operating/breakdown voltage of 800 V. The structure "800+" has an aspect ratio of 1:30.

The structure "800H" corresponds to a double MIM structure (e.g., like structure 500) in accordance with an embodiment of the present invention designed for an operating/breakdown voltage of 800V. The structure "800H" has an aspect ratio of 1:15.

The structure "1000+" corresponds to a conventional single MIM structure designed for an operating/breakdown voltage of 1 kV. The structure "1000+" has an aspect ratio of 1:20.

The structure "1000H" corresponds to a double MIM structure in accordance with an embodiment of the present invention designed for an operating/breakdown voltage of 1 kV. The structure "1000H" has an aspect ratio of 1:12.

As shown in FIG. 7, a superior mechanical stress performance was obtained using the structures of the present invention compared with the conventional structures across the various voltage profiles. This superior performance is attributed, as discussed above, to the shifting of a part of the mineral-type dielectric specific surface to the second MIM stack using the polymer dielectric.

FIG. 8 illustrates the capacitance density performance of an embodiment of the present invention. Specifically, FIG. 8 compares, as a function of trench depth, the capacitance density of the example capacitor structure "600H" with the conventional structure "600+" described above. As shown, the structure "600H" yields equivalent/greater capacitance density than structure "600+". However, the structure "600H" achieves this performance with more than 30% reduction of aspect ratio compared to the structure "600+". As described above, this reduction in aspect ratio translates in lower mechanical stress, lower electrical stress, and easier fabrication processing (etching/filling) due to the structure being less confined.

FIG. 9 illustrates the capacitance density performance of further embodiments of the present invention over a range of target voltage applications. Specifically, like FIG. 8, FIG. 9 also compares, as a function of trench depth, the capacitance densities of the capacitor structures "600H" and "600+", the capacitor structures "800H" and "800+", and the capacitor structures "1000H" and "1000+." Again, it can be observed that the structures "600H", "800H", and "1000H" according to the present invention result in equivalent, if not greater, capacitance density, and with a lower aspect ratio, than their respective convention counterpart structures "600+", "800+", and "1000+".

ADDITIONAL VARIANTS

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A capacitor structure, comprising:
   a silicon substrate having a trench structure formed therein;
   a dielectric layer disposed over a surface of the trench structure, conformal to said surface of the trench structure; and
   a filling layer disposed over the dielectric layer and into the trench structure, the filling layer comprising:
   a conductive layer;
   a polymer layer; and
   a further conductive layer disposed over the polymer layer and into the trench structure,
   wherein the conductive layer is disposed between the dielectric layer and the polymer layer, and
   wherein a trench depth of the trench structure ranges between 10 and 100 microns, an aspect ratio of the trench structure ranges between 1:10 and 1:60, a thickness of the dielectric layer ranges between 0.6 and 1.5 microns, a thickness of the conductive layer ranges between 10 and 500 nanometers, a thickness of the polymer layer ranges between 150 and 2000 nanometers, and a thickness of the further conductive layer ranges between 10 and 50 nanometers.

2. The capacitor structure of claim 1, wherein the conductive layer and the polymer layer completely fill the trench structure.

3. The capacitor structure of claim 1, wherein the further conductive layer comprises a metallic layer.

4. A capacitor structure, comprising:
   a silicon substrate having a trench structure formed therein;
   a dielectric layer disposed over a surface of the trench structure, conformal to said surface of the trench structure; and
   a filling layer disposed over the dielectric layer and into the trench structure, the filling layer comprising:
   a conductive layer; and
   a polymer layer,
   wherein the polymer layer is disposed between the dielectric layer and the conductive layer, and wherein a trench depth of the trench structure ranges between 10 and 100 microns, an aspect ratio of the trench structure ranges between 1:10 and 1:60, a thickness of the dielectric layer ranges between 0.6 and 1.5 microns, a thickness of the polymer layer ranges between 150 and 3000 nanometers, and a thickness of the conductive layer ranges between 10 and 50 nanometers.

5. The capacitor structure of claim 4, wherein the dielectric layer comprises a mineral-type dielectric layer.

6. The capacitor structure of claim 5, wherein the mineral-type dielectric comprises silicon dioxide, silicon nitride, or silicon oxynitride.

7. The capacitor structure of claim 4, wherein the conductive layer comprises a metallic layer or a polysilicon layer.

8. The capacitor structure of claim 7, wherein the metallic layer comprises titanium nitride, vanadium nitride, or tungsten nitride.

9. The capacitor structure of claim 4, wherein the polymer layer comprises Parylene AF-4.

10. A capacitor structure, comprising:
a silicon substrate having a trench structure formed therein;
a dielectric layer disposed over a surface of the trench structure, conformal to said surface of the trench structure; and
a filling layer disposed over the dielectric layer and into the trench structure, the filling layer comprising:
a conductive layer;
a polymer layer; and
a further conductive layer disposed over the polymer layer and into the trench structure,
wherein the conductive layer is disposed between the dielectric layer and the polymer layer,
wherein the further conductive layer is electrically connected to the conductive layer, and
wherein the thickness of the polymer layer is equal to the thickness of the dielectric layer multiplied by the ratio of the breakdown field of the material of the dielectric layer to the breakdown field of the material of the polymer layer.

* * * * *